(12) United States Patent
Louie et al.

(10) Patent No.: US 7,336,536 B2
(45) Date of Patent: Feb. 26, 2008

(54) HANDLING DEFECTIVE MEMORY BLOCKS OF NAND MEMORY DEVICES

(75) Inventors: Benjamin Louie, Fremont, CA (US); Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 10/876,878

(22) Filed: Jun. 25, 2004

(65) Prior Publication Data

US 2005/0286337 A1 Dec. 29, 2005

(51) Int. Cl.
*G11C 16/06* (2006.01)
(52) U.S. Cl. ............. 365/185.09; 365/201; 365/230.03
(58) Field of Classification Search ........... 365/185.09, 365/230.03, 201
See application file for complete search history.

(56) References Cited

U.S. PATENT DOCUMENTS

| | | | | |
|---|---|---|---|---|
| 5,524,231 A | * | 6/1996 | Brown | ............... 365/185.09 |
| 5,596,530 A | * | 1/1997 | Lin et al. | ............... 365/185.3 |
| 6,282,145 B1 | | 8/2001 | Tran et al. | |
| 6,542,391 B2 | * | 4/2003 | Pereira et al. | ............... 365/49 |
| 6,735,116 B2 | * | 5/2004 | Lee et al. | ............. 365/185.17 |
| 2002/0145907 A1 | | 10/2002 | Byeon et al. | |
| 2003/0072204 A1 | * | 4/2003 | Shiga et al. | ............... 365/201 |
| 2003/0117851 A1 | * | 6/2003 | Lee et al. | ............. 365/185.17 |
| 2004/0100811 A1 | * | 5/2004 | Pereira et al. | ............... 365/49 |

* cited by examiner

*Primary Examiner*—Thong Q. Le
(74) *Attorney, Agent, or Firm*—Leffert Jay & Polglaze, P.A.

(57) ABSTRACT

Apparatus and methods are provided. A NAND memory device has a memory array comprising a plurality of memory blocks and a volatile latch coupled to each of the memory blocks for selectively preventing testing of the respective memory block coupled thereto when that memory block is a known defective block. A non-volatile latch may also be coupled to each of the memory blocks for permanently preventing access, during normal operation of the memory device, to the respective memory block coupled thereto when that memory block is a known defective block.

37 Claims, 3 Drawing Sheets

HANDLING DEFECTIVE MEMORY BLOCKS OF NAND MEMORY DEVICES

TECHNICAL FIELD OF THE INVENTION

The present invention relates generally to NAND memory devices and in particular the present invention relates to handling defective memory blocks of NAND memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Defective blocks can occur during the manufacture of a flash memory array having rows and columns of memory cells. Typical defects can include bad memory cells, open circuits, shorts between a pair of rows, and shorts between a word line and bit line. For NOR memory devices, defective blocks are usually unacceptable, and redundant elements are often used to replace defective elements to salvage the NOR memory device. For NAND memory devices, however, it is acceptable to have a few defective blocks, e.g., say 40 out of 2040 blocks.

Defective blocks in NAND memory devices can cause problems during testing of these devices, e.g., performed at the back end of the manufacturing process. For example, the defective blocks may cause problems when testing the ability of the memory device to perform erase operations on its memory cells. Such tests may involve either chip-wide erases, where all of the blocks are selected for an erase, or a block-by-block erase, where the blocks are selected sequentially one at a time. Erase operations performed on the defective blocks increase test times. Moreover, performing erase operations on defective blocks with word-line-to-bit-line shorts can degrade the high voltage necessary for the erase. Another problem is that an end user may be able to access the defective blocks.

For the reasons stated above, and for other reasons stated below which will become apparent to those skilled in the art upon reading and understanding the present specification, there is a need in the art for alternative NAND memory devices.

SUMMARY

The above-mentioned problems with defective memory blocks of NAND memory devices and other problems are addressed by the present invention and will be understood by reading and studying the following specification.

For one embodiment, the invention provides a NAND memory device having a memory array with a plurality of memory blocks and an access circuit coupled to each of the memory blocks. Each access circuit is adapted to selectively prevent testing of the respective memory block coupled thereto when that memory block is a known defective block.

For another embodiment, the invention provides a NAND memory device having a memory array with a plurality of memory blocks and an access circuit coupled to each of the memory blocks. Each access circuit is adapted to permanently prevent access to the respective memory block coupled thereto when that memory block is a known defective block.

For another embodiment, the invention provides a NAND memory device having a memory array with a plurality of memory blocks, a block select circuit coupled to each of the memory blocks, a decoder coupled to each of the block select circuits, and a volatile latch coupled to each of the decoders and each of the block select circuits and thereby coupled to each of the memory blocks. Each volatile latch is adapted to selectively prevent activation of the respective block select circuit coupled thereto so as to prevent testing of the memory block coupled to that block select circuit when that memory block is a known defective block.

For another embodiment, the invention provides a NAND memory device having a memory array with a plurality of memory blocks, a block select circuit coupled to each of the memory blocks, a decoder coupled to each of the block select circuits, a volatile latch coupled to each of the decoders and each of the block select circuits, and a non-volatile latch coupled to each of the decoders and each of the block select circuits. Each volatile latch is adapted to selectively prevent activation of the respective block select circuit coupled thereto so as to prevent testing of the memory block coupled to that block select circuit when that memory block is a known defective block. Each non-volatile latch is adapted to permanently prevent activation, during normal operation of the memory device, of the respective block select circuit coupled thereto so as to permanently prevent access the memory block coupled to that block select circuit when that memory block is a known defective block.

For another embodiment, the invention provides a method of operating a NAND memory device during a test mode, including selectively preventing a known defective memory block of a memory array from being tested and indicating a pass condition for the memory block that is prevented from being tested.

For another embodiment, the invention provides a method of operating a NAND memory device, including, during a test mode of operation, selectively preventing a known defective memory block of a memory array from being tested, indicating a pass condition for the memory block that is prevented from being tested, and during normal operation, permanently preventing the known defective block from being accessed.

Further embodiments of the invention include methods and apparatus of varying scope.

DETAILED DESCRIPTION

Figure 1:
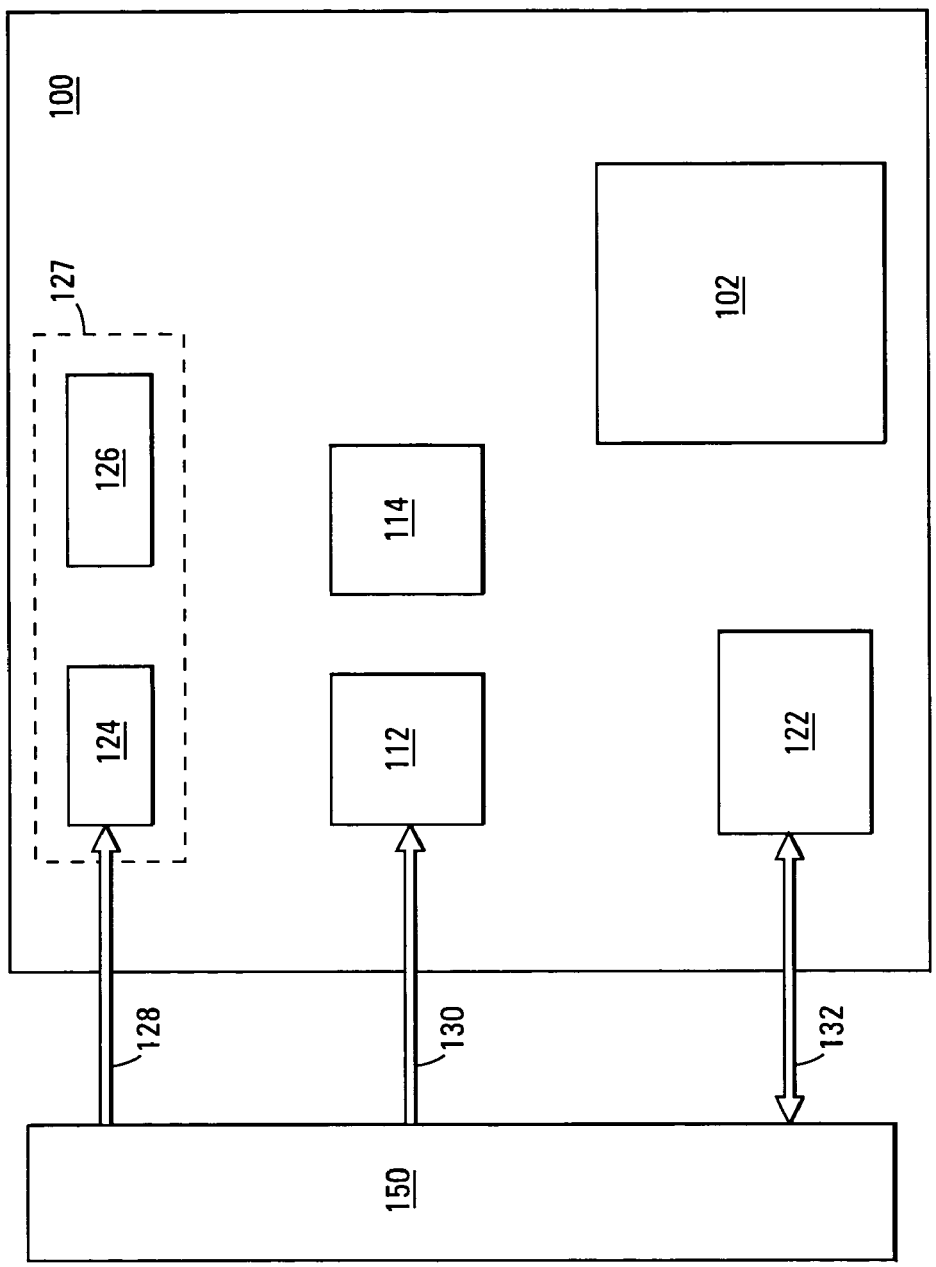
FIG. 1 is a block diagram illustration a portion of a NAND flash memory device according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustration of a portion of a NAND flash memory device 100 according to an embodiment of the present invention. Memory device 100 includes a memory array 102 having a plurality of memory cells arranged in row and column fashion. Each of the memory cells includes a floating-gate field-effect transistor capable of holding a charge for the non-volatile storage of data. Each of the cells can be electrically programmed on an individual basis by charging the floating gate.

The rows of memory array 102 are arranged in blocks, where a memory block is some discrete portion of the memory array 102. Individual word lines generally extend to only one memory block, while bit lines may extend to multiple memory blocks. The memory cells generally can be erased in blocks. Data, however, may be stored in the memory array 102 separate from the block structure.

Memory array 102 includes word lines intersecting local bit lines. Each column of memory array 102 includes a NAND string selectively coupled between one of the local bit lines and a source line. Each NAND string includes a plurality of memory cells (or floating-gate transistors), each cell located at an intersection of a word line and a local bit line. The memory cells of each NAND string are connected in series source to drain between a source select gate, e.g., a field-effect transistor (FET), and a drain select gate, e.g., an FET. Each source select gate is located at an intersection of a local bit line and a source select line, while each drain select gate is located at an intersection of a local bit line and a drain select line.

Typical construction of a floating gate transistor includes a source and a drain, a floating gate, and a control gate. The floating gate transistors of each memory block 102 have their control gates coupled to a word line. A column of the floating gate transistors is a NAND string coupled to a given local bit line. A row of the floating gate transistors are those transistors commonly coupled to a given word line.

Memory array 102 can be accessed using externally provided location addresses received by an address register 112 via address signal connections 130. The address signals are decoded, and one or more target memory cells are selected in response to the decoded address signals, using access circuitry 114 that includes decode and select circuitry.

Data is input and output through an I/O circuit 122 via data connections 132. I/O circuit 122 includes data output registers, output drivers and output buffers. Command execution logic 124 is provided to control the basic operations of the memory device 100 in response to control signals received via control signal connections 128. A state machine 126 may also be provided to control specific operations performed on the memory array and cells. The command execution logic 124 and/or state machine 126 can be generally referred to as control circuitry 127 to control read, write, erase and other memory operations. The control circuitry 127 is adapted to facilitate the methods of the various embodiments. The data connections 132 are typically used for bi-directional data communication. The memory can be coupled to an external processor 150 for operation or for testing. Examples of a processor 150 include a memory controller in a personal computer and a processor of tester hardware.

It will be appreciated by those skilled in the art that additional circuitry and control signals can be provided, and that the memory device of FIG. 1 has been simplified to help focus on the invention. It will further be understood that the above description of a memory device is intended to provide a general understanding of the memory and is not a complete description of all the elements and features of a typical memory device.

Figure 2:
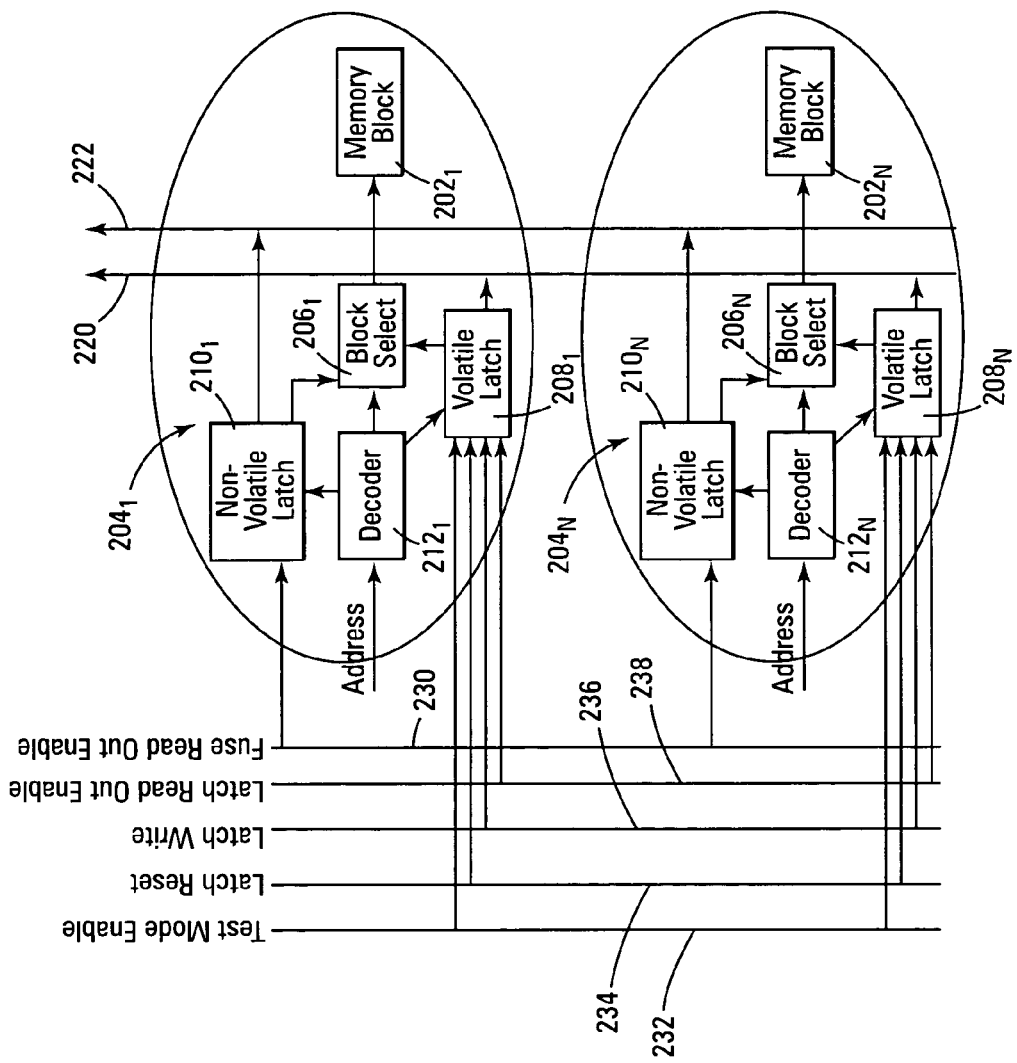
FIG. 2 is a block diagram of a portion of a NAND flash memory device according to another embodiment of the present invention.

FIG. 2 is a block diagram of a portion of a NAND flash memory device, such as the NAND flash memory device 100 of FIG. 1, according to another embodiment of the present invention. For example, the memory array 102 of memory device 100 may include memory blocks $202_1$ to $202_N$, shown in FIG. 2, and the access circuitry 114 of memory device 100 may include access circuits $204_1$ to $204_N$, shown in FIG. 2. Access circuits $204_1$ to $204_N$ are respectively coupled to memory blocks $202_1$ to $202_N$, as shown in FIG. 2.

Each access circuit 204 includes a block select circuit (or high-voltage switch) 206 coupled to a respective one of memory blocks 202. The select circuit 206 is coupled to a volatile latch 208, a non-volatile latch 210, e.g., one or more fusible elements that include fuses and/or anti-fuses, and a decoder 212 of the respective access circuit 204, as shown in FIG. 2. Each access circuit 204 is coupled by its respective volatile latch 208 to a volatile-latch read-out buss 220, e.g., for conveying outputs of the volatile latches to processor 150 via the control circuitry 127, I/O circuit 122, and data connections 132. Each volatile latch 208 is also coupled to the decoder 212 of the respective access circuit 204. Each access circuit 204 is also coupled by its respective non-volatile latch 210 to a non-volatile-latch read-out buss 222 that is connected to a voltage pump or voltage pump trims of memory device 100, for example. Each non-volatile latch 210 is also coupled to the decoder 212 of the respective access circuit 204.

For one embodiment, each access circuit 204 receives addresses at its respective decoder 212 from processor 150 via address signal connections 130 and address register 112. The addresses correspond to locations of memory cells of the memory blocks 202. For another embodiment, each access circuit 204 receives command signals at its respective non-volatile latch 210 and volatile latch 208 from the control circuitry 127 based on control signals received via control signal connections 128 from processor 150. For example, non-volatile latch 210 receives a fuse read out enable signal 230, and volatile latch 208 receives a test mode enable signal 232, a latch reset signal 234, a latch write signal 236, and a latch read out enable signal 238, as shown in FIG. 2.

During testing of memory blocks 202, such as backend testing at the end of the manufacturing process, testing of any of blocks 202 that have been concluded to be defective earlier in the manufacturing process is avoided by setting the volatile latches 208 associated with the defective memory blocks to prevent testing of the defective memory blocks. Testing known defective blocks can increase test times and can degrade the high voltage necessary for the erases performed during testing.

In particular, when the memory device is placed in a test mode by test mode enable signal 232, a volatile latch 208 associated with a defective memory block is set to a first state, using the latch read out enable signal 238, to prevent access, and thus testing, of the defective memory block. Specifically, volatile latch 208 prevents activation of its associated block select circuit 206, e.g., so as to prevent the block select circuit 206 from applying a high voltage to the defective memory block, such as high voltage used for an erase operation. Moreover, in its first state, the volatile latch 208 outputs a signal onto volatile-latch read-out buss 220 that can be used to indicate a pass status for the associated defective block. For one embodiment, volatile-latch read-out buss 220 conveys this signal to processor 150. For memory blocks that are indicated as being non-defective, e.g., earlier in the manufacturing process, the associated volatile latches are placed in a second state by the latch reset signal 234. In the second state, the volatile latches permit access to, and thus testing of, the associated non-defective memory blocks.

During normal operation of the memory device, a non-volatile latch 210 associated with a known defective memory block is used to permanently prevent access to a known defective memory block. Specifically, non-volatile latch 210 is set to a first state when a memory block is determined to be defective to prevent activation of its associated block select circuit 206, e.g., so as to prevent the block select circuit 206 from applying erase or programming voltages to the known defective memory block. This causes control circuitry, such as the control circuitry 127 of memory device 100, to relay a failed block (or block error) message to a processor, such as processor 150, when an attempt is made to access the defective block. Moreover, voltage pumps within the block select circuit look to the state of the non-volatile latch 210 to determine whether voltage trims associated with the voltage pumps should be modified. When non-volatile latch 210 is in its first state, the voltage trims are modified so that the voltage pumps are not activated or are activated at a lower voltage. Non-volatile latch 210 is set to a second state when its associated memory block is determined to be not defective. In its second state, non-volatile latch 210 allows assess to the associated block select circuit.

Figure 3:
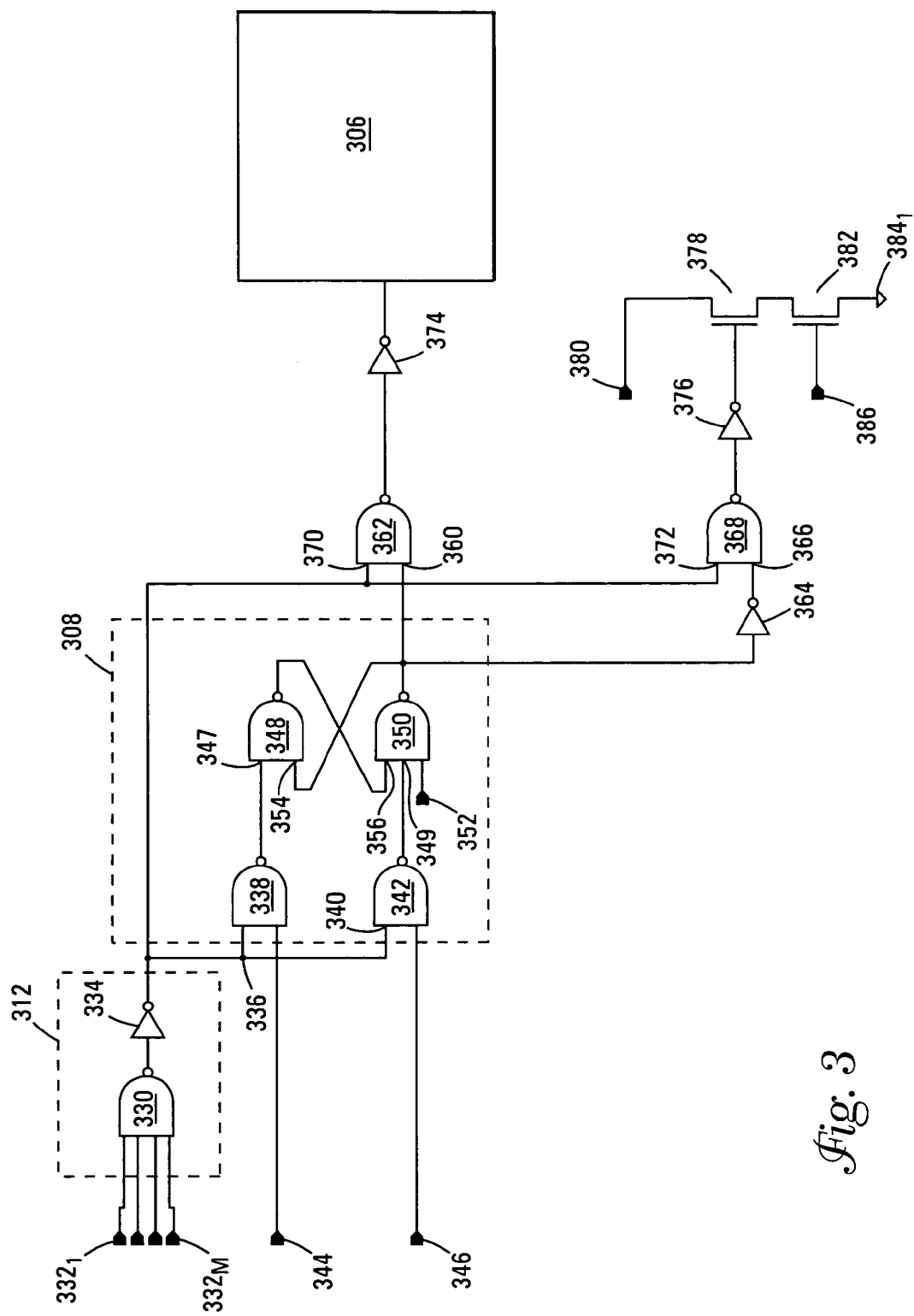
FIG. 3 is a logic diagram of a portion of an access circuit of a NAND flash memory device according to another embodiment of the present invention.

FIG. 3 is a logic diagram of a portion of an access circuit, such as an access circuit 204, that includes a decoder 312 coupled to a volatile latch 308 coupled to a block select circuit (or high-voltage switch) 306 according to another embodiment of the present invention. Decoder 312 includes a NAND gate 330 with inputs connected to address input nodes $332_1$ to $332_M$ for receiving addresses, e.g., from address register 112 of memory device 100, and an output coupled to an inverter 334 of decoder 312. An output of inverter 334 is coupled to a first input 336 of a NAND gate 338 of volatile latch 308 and to a first input 340 of a NAND gate 342 of volatile latch 308.

NAND gate 338 has a second input connected to an input node 344, e.g., for receiving the latch write signal 236, and NAND gate 342 has a second input connected to an input node 346, e.g., for receiving the latch reset signal 234. An output of NAND gate 338 is coupled to a first input 347 of a NAND gate 348 of volatile latch 308, and an output of NAND gate 342 is coupled to a first input 349 of a NAND gate 350 of volatile latch 308. A second input of NAND gate 350 is connected to a global input node 352 that receives a global clear signal, e.g., from control circuitry 127 of memory device 100 of FIG. 1. The global clear signal is received at the access circuit for each of the memory blocks to reset the volatile latch of each access circuit. For example, each of the access circuits 204 receives global clear signal for resetting all of volatile latches 208. An output of NAND gate 350 is coupled to a second input 354 of NAND gate 348, while an output of NAND gate 348 is coupled to a third input 356 NAND gate 350.

The output of NAND gate 350 is also coupled to a first input 360 of a NAND gate 362 and to an input of an inverter 364 that has an output coupled to a first input 366 of a NAND gate 368. A second input 370 of NAND gate 362 and a second input 372 of NAND gate 368 are coupled to the output of inverter 334. An output of NAND gate 362 is coupled to an input of an inverter 374 that has an output coupled to block select circuit 306.

An output of NAND gate 368 is coupled to an input of an inverter 376 that has an output coupled to a gate of field-effect transistor 378. Field-effect transistor 378 has a drain coupled to an input/output node 380, e.g., for outputting a latch read out signal onto the volatile-latch read-out buss 220. Field-effect transistor 378 has a source coupled to a drain of field-effect transistor 382 that has its source coupled to a ground potential node 384 and its gate coupled to an input node 386, e.g., for receiving the latch read out enable signal 238.

As discussed above in conjunction with FIG. 2, a volatile latch associated with a defective memory block is set to prevent activation of the block select circuit associated with the defective memory block during a test mode. For one embodiment, the volatile latch 308 is set to a first state for preventing activation of block select circuit 306 when the latch read out enable signal 238 is a logic high at input node 386, the addresses are logic highs at input nodes 332, the latch write signal 236 is a logic low at input 344, and the latch reset signal 243 is a logic high at input 346. This produces a logic low at the output of inverter 374, and thus at an input of block select circuit 306, that prevents activation of block select circuit 306. Moreover, a logic high is received at the control gate of field-effect transistor 378 from inverter 376 that when coupled with the logic high at input 386, enables the latch read out signal to be output onto the volatile-latch read-out buss 220 via input/output node 380.

When volatile latch 308 is associated with a non-defective memory block, it is set to a second state for allowing activation of block select circuit 306 to permit testing of the non-defective memory block. For one embodiment, this is accomplished when addresses are logic highs at input nodes 332, the latch reset signal 234 is a logic low at input 346, and the latch write signal 236 is a logic high at input 344. This produces a logic high at the output of inverter 374, and thus at an input of block select circuit 306, that activates block select circuit 306. Moreover, a logic low is received at field effect transistor 378, producing high impedance at input/output node 380. By addressing the block and activating field effect transistor 382, the state of the volatile latch 308 may be determined by the state of input/output node 380, i.e., when input/output node 380 is ground, volatile latch 308 is set to the first state and when node 380 presents a high impedance, volatile latch 308 is set to the second state.

Note that other logic circuits could be used to selectively disable the block select circuitry of a known defective block and provide a signal indicating the status of the block to permit the tester apparatus to proceed without testing the block.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A NAND memory device comprising:
   a memory array comprising a plurality of memory blocks; and
   an access circuit coupled to each of the memory blocks;
   wherein each access circuit is adapted to independently selectively prevent testing of the respective memory block coupled thereto when that memory block is a known defective block and when a test mode enable signal received at each access circuit places the NAND memory device in a test mode.

2. The NAND memory device of claim 1, wherein each access circuit is further adapted to provide an indication of its state.

3. The NAND memory device of claim 1, wherein each access circuit is further adapted to permanently prevent access to the respective memory block coupled thereto when that memory block is a known defective block and the memory device is in a normal mode of operation.

4. The NAND memory device of claim 1, wherein each access circuit is further adapted to selectively allow testing of the respective memory block coupled thereto when that memory block is not indicated to be defective.

5. A NAND memory device comprising:
   a memory array comprising a plurality of memory blocks;
   a block select circuit coupled to each of the memory blocks;
   a decoder coupled to each of the block select circuits; and
   a volatile latch coupled to each of the decoders and each of the block select circuits;
   wherein each volatile latch is adapted to selectively prevent activation of the respective block select circuit coupled thereto so as to prevent testing of the memory block coupled to that block select circuit when that memory block is a known defective block.

6. The NAND memory device of claim 5, wherein each volatile latch is further adapted to provide an indication of its state.

7. The NAND memory device of claim 5, wherein each volatile latch is further adapted to selectively allow testing of the respective memory block coupled thereto when the memory block is not indicated to be defective.

8. A NAND memory device comprising:
   a memory array comprising a plurality of memory blocks; and
   an access circuit coupled to each of the memory blocks;
   wherein each access circuit is adapted to independently permanently prevent access to the respective memory block coupled thereto when that memory block is a known defective block; and
   wherein each access circuit is adapted to independently selectively prevent testing of the respective memory block coupled thereto when that memory block is a known defective block.

9. The NAND memory device of claim 8, wherein each access circuit is further adapted to provide an indication of an error for the respective memory block coupled thereto while the access circuit is permanently preventing access to that memory block and an attempt is made to access that memory block.

10. A NAND memory device comprising:
    a memory array comprising a plurality of memory blocks;
    a block select circuit coupled to each of the memory blocks;
    a decoder coupled to each of the block select circuits; and
    a fusible element coupled to each of the decoders and each of the block select circuits, wherein each fusible element is coupled to receive an input from the decoder coupled thereto;
    wherein each fusible element is adapted to permanently prevent activation, during normal operation of the memory device, of the respective block select circuit coupled thereto so as to permanently prevent access of the memory block coupled to that block select circuit when that memory block is a known defective block.

11. The NAND memory device of claim 10, wherein each fusible element is further adapted to provide a control signal, during normal operation of the memory device, to modify voltage pump trims of the memory device when that block select circuit is coupled to a known defective memory block.

12. A NAND memory device comprising:
a memory array comprising a plurality of memory blocks;
a block select circuit coupled to each of the memory blocks;
a decoder coupled to each of the block select circuits; and
a fusible element coupled to each of the decoders and each of the block select circuits;
wherein each fusible element is adapted to permanently prevent activation, during normal operation of the memory device, of the respective block select circuit coupled thereto so as to permanently prevent access of the memory block coupled to that block select circuit when that memory block is a known defective block; and
wherein each fusible element is further adapted to provide a control signal, during normal operation of the memory device, to modify voltage pump trims of the memory device when that block select circuit is coupled to a known defective memory block.

13. A NAND memory device comprising:
a memory array comprising a plurality of memory blocks;
a block select circuit coupled to each of the memory blocks;
a decoder coupled to each of the block select circuits;
a volatile latch coupled to each of the decoders and each of the block select circuits; and
a non-volatile latch coupled to each of the decoders and each of the block select circuits and thereby coupled to each of the memory blocks;
wherein each volatile latch is adapted to selectively prevent activation of the respective block select circuit coupled thereto so as to prevent testing of the memory block coupled to that block select circuit when that memory block is a known defective memory block; and
wherein each non-volatile latch is adapted to permanently prevent activation, during normal operation of the memory device, of the respective block select circuit coupled thereto so as to permanently prevent access to the memory block coupled to that block select circuit when that memory block is a known defective memory block.

14. The NAND memory device of claim 13, wherein each volatile latch is further adapted to provide an indication of its state.

15. The NAND memory device of claim 13, wherein each volatile latch is further adapted to selectively allow testing of the respective memory block coupled thereto when the memory block is not indicated to be defective.

16. The memory NAND device of claim 13, wherein each non-volatile latch is further adapted to provide a control signal, during normal operation of the memory device, to modify voltage pump trims of the memory device when that block select circuit is coupled to a known defective memory block.

17. A NAND memory device comprising:
a memory array comprising a plurality of memory blocks;
control circuitry for controlling memory operations;
an input/output circuit for inputting data to and outputting data from the memory device;
an address register for receiving externally provided location addresses for accessing the memory array;
a block select circuit coupled to each of the memory blocks;
a decoder coupled to each of the block select circuits and the address register; and
a volatile latch coupled to each of the decoders and each of the block select circuits, each volatile latch coupled to the control circuitry;
wherein each volatile latch is adapted to selectively prevent activation of the respective block select circuit coupled thereto so as to prevent testing of the memory block coupled to that block select circuit when that memory block is known to be defective; and
wherein each volatile latch is further adapted to provide a control signal to the input/output circuit for output indicative of a pass status for the respective memory block coupled thereto while the respective volatile latch is preventing testing of that memory block.

18. The NAND memory device of claim 17, wherein each volatile latch is further adapted to selectively allow testing of the respective memory block coupled thereto when the memory block is not indicated to be defective.

19. A NAND memory device comprising:
a memory array comprising a plurality of memory blocks;
control circuitry for controlling memory operations;
an input/output circuit for inputting data to and outputting data from the memory device;
an address register for receiving externally provided location addresses for accessing the memory array;
a block select circuit coupled to each of the memory blocks;
a decoder coupled to each of the block select circuits and the address register;
a volatile latch coupled to each of the decoders and each of the block select circuits, each volatile latch coupled to the control circuitry; and
a non-volatile latch coupled to each of the decoders and each of the block select circuits;
wherein each volatile latch is adapted to selectively prevent activation of the respective block select circuit coupled thereto so as to prevent testing of the memory block coupled to that block select circuit when that memory block is is known to be defective;
wherein each volatile latch is further adapted to provide a control signal to the input/output circuit for output indicative of a pass status for the respective memory block coupled thereto while the respective volatile latch is preventing testing of that memory block;
wherein each non-volatile latch is adapted to permanently prevent activation, during normal operation of the memory device, of the respective block select circuit coupled thereto so as to permanently prevent access to the memory block coupled to that block select circuit when that memory block is known to be defective; and
wherein each non-volatile latch is further adapted to provide a control signal, during normal operation of the memory device, to modify voltage pump trims of the memory device when that block select circuit is coupled to a known defective memory block.

20. The NAND memory device of claim 19, wherein each volatile latch is further adapted to selectively allow testing of the respective memory block coupled thereto when the memory block is not indicated to be defective.

21. A NAND memory device comprising:
a memory array comprising a plurality of memory blocks;
a block select circuit coupled to each of the memory blocks;
control circuitry for controlling memory operations of the memory device;
a first NAND gate having one or more address inputs and an output coupled to a first inverter;
a second NAND gate having a first input coupled to an output of the first inverter and a second input connected to a first input node for receiving a first command signal from the control circuitry;
a third NAND gate having a first input coupled to an output of the first inverter and a second input connected to a second input node for receiving a second command signal from the control circuitry;
a fourth NAND gate having a first input coupled to an output of the first inverter and a second input, an output of the fourth NAND gate coupled to an input of a second inverter having an output coupled to the block select circuit;
a fifth NAND gate having a first input coupled to an output of the first inverter, a second input connected to an output of a third inverter, and an output connected to an input of a fourth inverter;
a first field-effect transistor connected between a third node and a second field-effect transistor, a control gate of the first field-effect transistor connected to a fourth node for receiving a third command signal from the control circuitry, a control gate of the second field-effect transistor coupled to an output of the fourth inverter, the second field-effect transistor connected to an input/output node;
a sixth NAND gate having a first input coupled to an output of the second NAND gate; and
a seventh NAND gate having a first input coupled to an output of the third NAND gate, a second input coupled to an output of the sixth NAND gate, a third input connected to a global input node, and an output connected to a second input of the sixth NAND gate, to the second input of the fourth NAND gate, and to an input of the third inverter.

22. The NAND memory device of claim 21, wherein the third input node is at a ground potential.

23. A method of operating a NAND memory device during a test mode, comprising:
selectively preventing a known defective memory block of a memory array from being tested; and
indicating a pass condition for the known defective memory block that is prevented from being tested.

24. The method of claim 23, wherein selectively preventing a known defective memory block of a memory array from being tested comprises setting a volatile latch of the memory array corresponding to the known defective memory block so as to prevent activation of a block select circuit that is coupled to the volatile latch and the known defective memory block.

25. The method of claim 24, wherein indicating a pass condition for the known defective memory block that is prevented from being tested comprises outputting a signal from the volatile latch.

26. A method of operating a NAND memory device during a test mode, comprising:
selectively preventing a known defective memory block of a memory array of the memory device from being tested;
indicating a pass condition for the known defective memory block that is prevented from being tested; and
selectively allowing non-defective memory blocks of the memory array to be tested.

27. The method of claim 26, wherein selectively preventing a known defective memory block of a memory array from being tested comprises setting a volatile latch of the memory array corresponding to the known defective memory block so as to prevent activation of a block select circuit that is coupled to the volatile latch and the known defective memory block.

28. The method of claim 27, wherein indicating a pass condition for the known defective memory block that is prevented from being tested comprises the volatile latch of the memory array corresponding to the defective memory block providing a control signal to a tester connected to the memory device.

29. A method of operating a NAND memory device during a test mode, comprising:
when a memory block of a memory array of the memory device is determined to be defective, setting a volatile latch of the memory array corresponding to the memory block to a first state so as to prevent testing of the memory block;
indicating a pass condition for the memory block while the volatile latch is at the first state; and
when the memory block is indicated as being non-defective, setting the volatile latch of the memory array to a second state so as to allow testing of the memory block.

30. The method of claim 29, wherein indicating a pass condition comprises the volatile latch providing a control signal to a tester connected to the memory device.

31. The method of claim 29, wherein setting the volatile latch to the first state prevents activation of a block select circuit coupled to the memory block and the volatile latch to prevent access to the memory block.

32. A method of operating a NAND memory device during a test mode, comprising:
receiving one or more addresses at a decoder of a memory array corresponding to a memory block of the memory array, the addresses corresponding to memory cell locations of the memory block;
when the memory block is known to be defective, receiving a first command signal at a volatile latch of the memory array corresponding to the memory block and coupled to the decoder to set the volatile latch at a first state so as to prevent activation of a block select circuit that is coupled to the decoder to prevent testing of the memory block;
receiving a second command at the volatile latch for enabling the volatile latch to provide a control signal indicative of a pass condition for the memory block when the volatile latch is at the first state; and
when the memory block is indicated as being non-defective, receiving a third command signal at the volatile latch to set the volatile latch at a second state so as to permit activation of the block select circuit to allow testing of the memory block.

33. A method of operating a NAND memory device, comprising:
permanently preventing a known defective block of a memory array from being accessed by using a fusible element to permanently prevent activation of a block select circuit that is coupled to the fusible element and the defective memory block;

when an attempt is made to access the defective block, modifying voltage trims if the fusible element indicates a known defect; and indicating an error when the attempt is made to access the defective block.

34. The method of claim 33, wherein modifying the voltage trims is in response to receiving a command signal from control circuitry of the memory device at the fusible element when the attempt is made to access the defective block.

35. A method of operating a NAND memory device, comprising:

during a test mode of operation selectively preventing a known defective memory block of a memory array from being tested;

indicating a pass condition for the known defective memory block that is prevented from being tested; and during normal operation, permanently preventing the known defective block from being accessed.

36. The method of claim 35, wherein selectively preventing a known defective memory block of a memory array from being tested comprises setting a volatile latch of the memory array corresponding to the known defective memory block so as to prevent activation of a block select circuit that is coupled to the volatile latch and the known defective memory block.

37. The method of claim 35, wherein permanently preventing the known defective block from being accessed comprises using a fusible element to permanently prevent activation of a block select circuit that is coupled to the fusible element and the known defective memory block.

* * * * *

UNITED STATES PATENT AND TRADEMARK OFFICE
CERTIFICATE OF CORRECTION

| | | |
|---|---|---|
| PATENT NO. | : 7,336,536 B2 | Page 1 of 1 |
| APPLICATION NO. | : 10/876878 | |
| DATED | : February 26, 2008 | |
| INVENTOR(S) | : Louie et al. | |

It is certified that error appears in the above-identified patent and that said Letters Patent is hereby corrected as shown below:

In column 10, line 47, in Claim 19, after "block is" delete "is".

Signed and Sealed this

Third Day of June, 2008

JON W. DUDAS
*Director of the United States Patent and Trademark Office*